US009074725B2

(12) United States Patent
Trotsky

(10) Patent No.: US 9,074,725 B2
(45) Date of Patent: Jul. 7, 2015

(54) MOBILE ELECTRONIC DEVICE POSITIONING UNIT

(76) Inventor: Kevin Trotsky, Denver, CO (US)

( * ) Notice: Subject to any disclaimer, the term of this patent is extended or adjusted under 35 U.S.C. 154(b) by 555 days.

(21) Appl. No.: 13/194,320

(22) Filed: Jul. 29, 2011

(65) Prior Publication Data

US 2012/0025684 A1 Feb. 2, 2012

Related U.S. Application Data

(60) Provisional application No. 61/400,520, filed on Jul. 29, 2010, provisional application No. 61/414,747, filed on Nov. 17, 2010, provisional application No. 61/424,973, filed on Dec. 20, 2010.

(51) Int. Cl.
*A47B 97/04* (2006.01)
*H05K 5/00* (2006.01)
*F16M 11/04* (2006.01)
*A45F 5/00* (2006.01)
*F16M 11/20* (2006.01)
*F16M 13/00* (2006.01)
*H05K 5/02* (2006.01)

(52) U.S. Cl.
CPC ............... *F16M 11/043* (2013.01); *A45F 5/00* (2013.01); *A45F 2200/0525* (2013.01); *F16M 11/2057* (2013.01); *F16M 13/00* (2013.01); *H05K 5/0204* (2013.01)

(58) Field of Classification Search
CPC . F16M 11/043; F16M 11/2057; F16M 13/00; H05K 5/0204; A45F 3/14; A45F 5/00; A45F 2005/008; A45F 220/0525

USPC .............. 248/441.1, 688, 451, 452, 453, 126, 248/558, 444; 281/42; 361/679.01, 679.03; 294/25; 224/217
See application file for complete search history.

(56) References Cited

U.S. PATENT DOCUMENTS

| | | | | |
|---|---|---|---|---|
| 1,071,428 A | * | 8/1913 | Jones | 248/448 |
| 5,457,745 A | * | 10/1995 | Wang | 379/454 |
| 5,979,940 A | | 11/1999 | Araghi | |
| 6,464,185 B1 | * | 10/2002 | Minelli et al. | 248/183.1 |
| 6,646,864 B2 | | 11/2003 | Richardson | |
| 6,672,558 B2 | | 1/2004 | Li | |
| 6,726,070 B2 | * | 4/2004 | Lautner | 224/221 |
| 6,788,527 B2 | | 9/2004 | Doczy et al. | |
| 7,312,984 B2 | | 12/2007 | Richardson et al. | |
| 7,343,184 B2 | | 3/2008 | Rostami | |
| 7,380,759 B1 | | 6/2008 | Whiteside et al. | |
| 7,418,097 B2 | * | 8/2008 | Chang | 379/446 |

(Continued)

OTHER PUBLICATIONS

International Preliminary Report on Patentability for International (PCT) Patent Application No. PCT/US2011/045921, mailed Feb. 7, 2013 9 pages.

(Continued)

*Primary Examiner* — Anita M King
(74) *Attorney, Agent, or Firm* — Sheridan Ross P.C.

(57) ABSTRACT

A mobile device positioning unit is provided that is designed to operably interconnect to a mobile electronic device storage case. Upon actuation of triggers, or similar actuation mechanisms, associated with a palm grip of the unit, the positioning unit is able to transition along the length of the mobile device or rotate relative thereto. The unit may be selectively or partially disconnected from the storage case to provide a stand that allows the mobile electronic device to be propped up.

15 Claims, 19 Drawing Sheets

(56) References Cited

U.S. PATENT DOCUMENTS

| | | | |
|---|---|---|---|
| 7,453,436 B2 | 11/2008 | Ruiz | |
| 7,542,052 B2* | 6/2009 | Solomon et al. | 345/659 |
| 7,564,679 B2* | 7/2009 | Chen et al. | 361/679.21 |
| 7,612,997 B1 | 11/2009 | Diebel et al. | |
| 7,634,082 B2 | 12/2009 | Medhin | |
| 7,675,609 B2 | 3/2010 | Hinchliff et al. | |
| D615,078 S | 5/2010 | Bradley | |
| 8,066,241 B2* | 11/2011 | Yu et al. | 248/286.1 |
| 8,120,896 B2* | 2/2012 | Mori et al. | 361/679.03 |
| 8,240,628 B2* | 8/2012 | Huang | 248/316.1 |
| 8,243,444 B2* | 8/2012 | Kawada et al. | 361/679.59 |
| 8,413,943 B1* | 4/2013 | Li | 248/454 |
| 8,616,423 B2* | 12/2013 | Wizikowski | 224/218 |
| 8,690,210 B1* | 4/2014 | May | 294/25 |
| 8,740,270 B1* | 6/2014 | Mizell et al. | 294/25 |
| 8,833,820 B1* | 9/2014 | Hill | 294/25 |
| 2004/0226973 A1 | 11/2004 | Kao | |
| 2005/0101182 A1 | 5/2005 | Nakamura et al. | |
| 2005/0200608 A1 | 9/2005 | Ulla et al. | |
| 2007/0262223 A1 | 11/2007 | Wang et al. | |
| 2009/0219677 A1* | 9/2009 | Mori et al. | 361/679.03 |
| 2010/0096517 A1* | 4/2010 | Lampman et al. | 248/125.7 |
| 2010/0123062 A1* | 5/2010 | Jones et al. | 248/222.14 |
| 2010/0294908 A1* | 11/2010 | Mish et al. | 248/451 |
| 2010/0296235 A1* | 11/2010 | Takemasa et al. | 361/679.21 |
| 2011/0267748 A1* | 11/2011 | Lane et al. | 361/679.01 |
| 2011/0279959 A1* | 11/2011 | Lopez | 361/679.03 |
| 2011/0299231 A1* | 12/2011 | Gaddis et al. | 361/679.01 |
| 2012/0068043 A1* | 3/2012 | Daigle et al. | 248/682 |
| 2012/0074272 A1* | 3/2012 | Hull | 248/122.1 |
| 2012/0075799 A1* | 3/2012 | Pollex | 361/679.56 |
| 2012/0104185 A1* | 5/2012 | Carroll | 248/27.1 |
| 2012/0113572 A1* | 5/2012 | Gaddis et al. | 361/679.01 |
| 2013/0069381 A1* | 3/2013 | Sakamoto | 294/142 |
| 2013/0295549 A1* | 11/2013 | Hills | 434/379 |
| 2013/0300141 A1* | 11/2013 | Byrne | 294/25 |
| 2015/0009610 A1* | 1/2015 | London et al. | 361/679.03 |

OTHER PUBLICATIONS

International Search Report for International (PCT) App. No. PCT/US2011/045921, mailed Jan. 19, 2012.

Written Opinion for International (PCT) App. No. PCT/US2011/045921, mailed Jan. 19, 2012.

* cited by examiner

MOBILE ELECTRONIC DEVICE POSITIONING UNIT

This application claims the benefit of U.S. Provisional Patent Application Ser. No. 61/400,520 filed Jul. 29, 2010, the entire disclosure of which is incorporated by reference herein. This application also claims the benefit of U.S. Provisional Patent Application Ser. Nos. 61/414,747, filed Nov. 17, 2010, and 61/424,973, filed Dec. 20, 2010, the entire disclosures of which are incorporated by reference herein.

FIELD OF THE INVENTION

Embodiments of the present invention generally relate to a device for selective interconnection to a mobile electronic device. More specifically, one embodiment of the present invention is adapted for selective interconnection to an iPad®, a Kindle®, a personal computer, a tablet PC, a netbook, an e-reader, a communication device, and other similar electronic devices, which enhances the use thereof.

BACKGROUND OF THE INVENTION

Portable electronic devices such as tablet computers, netbooks, e-readers, iPads®, Kindles®, personal computers, communication devices, and other similar mobile devices (hereafter "electronic device") have become increasingly popular. One drawback of these devices is that in some instances their size and shape renders them difficult to position and use in a hands-free manner. More specifically, it is often desirable to tilt the electronic device to enhance readability or functionality, which is usually done using one or two hands. After holding the electronic device for an extended time the user will often become tired and the amount of holding force and associated stability applied to the electronic device will decrease. Electronic device stability affects readability of the electronic device. Further, stability is directly related to the possibility of dropping the electronic device. Holding an electronic device also does not permit the use of one or both hands for other activities that may be related to the functions being performed by an electronic device, i.e. typing. Further, the nature of some electronic devices, such as iPads®, which are sleek, thin, and lightweight, render them difficult to grasp.

Thus, it is desirable to provide a grip or similar device for selective interconnection to the electronic device to facilitate use thereof. Embodiments of the present invention, which will be described in detail below, provide a dynamic user interface that allows the electronic device to be used in a hands-free manner.

SUMMARY OF THE INVENTION

It is one aspect that the present invention to provide a protective storage case for selective interconnection to an electronic device. In one embodiment of the present invention, the storage case is a rigid or semi rigid shell designed to engage the back surface and at least one edge of the electronic device. One of skill in the art will appreciate that the case may be entirely rigid or include non-rigid members that function as shock absorbers that the electronic device from impact damage.

It is another aspect of the present invention to provide a positioning unit interconnected to the case. In one embodiment of the present invention, the user interface is a palm rest with an associated strap that maintains the user's hand onto the palm rest. The palm rest may be operably interconnected to the case which allows the case to move relative to the palm rest. More specifically, the case of some embodiments include rails that receive a slide clutch and a slide clutch actuator of the palm rest. In operation, activating the slide clutch actuator will release the slide clutch and allow the palm rest to slide along the rails and thus move along the case. In one embodiment, activation of the slide clutch is initiated when the slide clutch actuator is depressed by a user's finger or thumb. When pressure is released from the slide clutch actuator, the slide clutch locks and maintains the position of the palm grip on the rails. The sliding functionality provided by those embodiments of the invention allows users to find and fix a comfortable electronic device viewing and use position. One of skill in the art will appreciate that the rails may be integrated into the electronic device or interconnected thereto.

It is another aspect of the present invention to provide a positioning unit that allows for selective alteration of the angular orientation of the held electronic device. More specifically, some embodiments provide swiveling palm grip. The palm grip employs a swivel clutch that is selectively actuated by the user wherein depression of a swivel clutch actuator allows one portion of the grip to rotate relative to another portion of the grip. Thus, when the swivel clutch is disengaged, the mobile electronic device is able to rotate about its normal axis. The swivel clutch actuator may be comprised of finger or thumb buttons positioned adjacent to the palm rest. When the swivel clutch is released, the swivel clutch locks and rotation is prevented. In this manner, the swivel clutch allows a user to rotate and fix the use and viewing position of the mobile electronic device.

As one of skill in the art will appreciate, some positioning units of the contemplated invention may employ transitional and rotational functionality. Further, transitioning and rotation of the palm rest relative to the electronic device may be achieved with selective locking mechanisms not necessarily defined as a "clutch.".

It is yet another aspect of the present invention to provide an ergonomic unit that is easy to use. More specifically, the palm rest may be made of a material that is soft and resilient to enhance user comfort. The material may also reduce the generation of perspiration and associated odors. Further, the material and construction of the palm rest reduces the transmission of heat from the user's hand to the electronic device.

Again, the contemplated device allows the attached electronic device to be positioned in various ways. For example, when slid to the ends of the rails, the palm rest creates a low-profile stand such that is ideal for typing or close up viewing. In addition, in one embodiment of the present invention the palm rest is partially removable from one rail at a time. When dis-associated from one rail, the palm rest is free to pivot about the other rail to form a stand for propping the electronic device on a horizontal surface. Thus, the electronic device can be positioned in a 1) viewing landscape mode (propped about fifteen degrees from vertical), 2) typing landscape mode (supported about fifteen degrees from horizontal), 3) viewing portrait mode (propped about fifteen degrees from vertical), and portrait mode typing (supported about fifteen degrees from horizontal which is a typing mode).

It is another aspect of embodiments of the present invention to provide a device for selectively positioning an interconnected electronic device, comprising: a case that is adapted to selectively receive the electronic device; a first rail interconnected to the case; a second rail interconnected to the case and spaced from the first rail in a parallel relationship; a plate slidingly engaged to the first rail and the second rail; and a palm rest operably interconnected to the plate.

It is still yet another aspect of the present invention to provide a device for selective association with an electronic device, comprising: a base portion that is adapted to be selectively associated with the electronic device; a user interface operably interconnected to the base portion, the user interface capable of rotating relative to the base portion and being locked relative to the base portion.

It is another aspect of the present invention to provide a system for securing and selectively positioning an electronic device, comprising: a case that selectively receives the electronic device; a base portion that is selectively associated with the case; and a user interface operably interconnected to the base portion, the user interface capable of rotating relative to the base portion and being locked relative to the base portion.

It is another aspect of the present invention to provide a system for securing and selectively positioning an electronic device, comprising: a base member having a plurality of arms adapted for selective interconnection with an edge of the electronic device; and a user interface operatively interconnected to said base portion, said user interface capable of rotating relative to said base member.

The Summary of the Invention is neither intended nor should it be construed as being representative of the full extent and scope of the present invention. Moreover, references made herein to "the present invention" or aspects thereof should be understood to mean certain embodiments of the present invention and should not necessarily be construed as limiting all embodiments to a particular description. The present invention is set forth in various levels of detail in the Summary of the Invention as well as in the attached drawings and the Detailed Description of the Invention and no limitation as to the scope of the present invention is intended by either the inclusion or non-inclusion of elements, components, etc. in this Summary of the Invention. Additional aspects of the present invention will become more readily apparent from the Detail Description, particularly when taken together with the drawings.

BRIEF DESCRIPTION OF THE DRAWINGS

The accompanying drawings, which are incorporated in and constitute a part of the specification, illustrate embodiments of the invention and together with the general description of the invention given above and the detailed description of the drawings given below, serve to explain the principles of these inventions.

Figure 1:
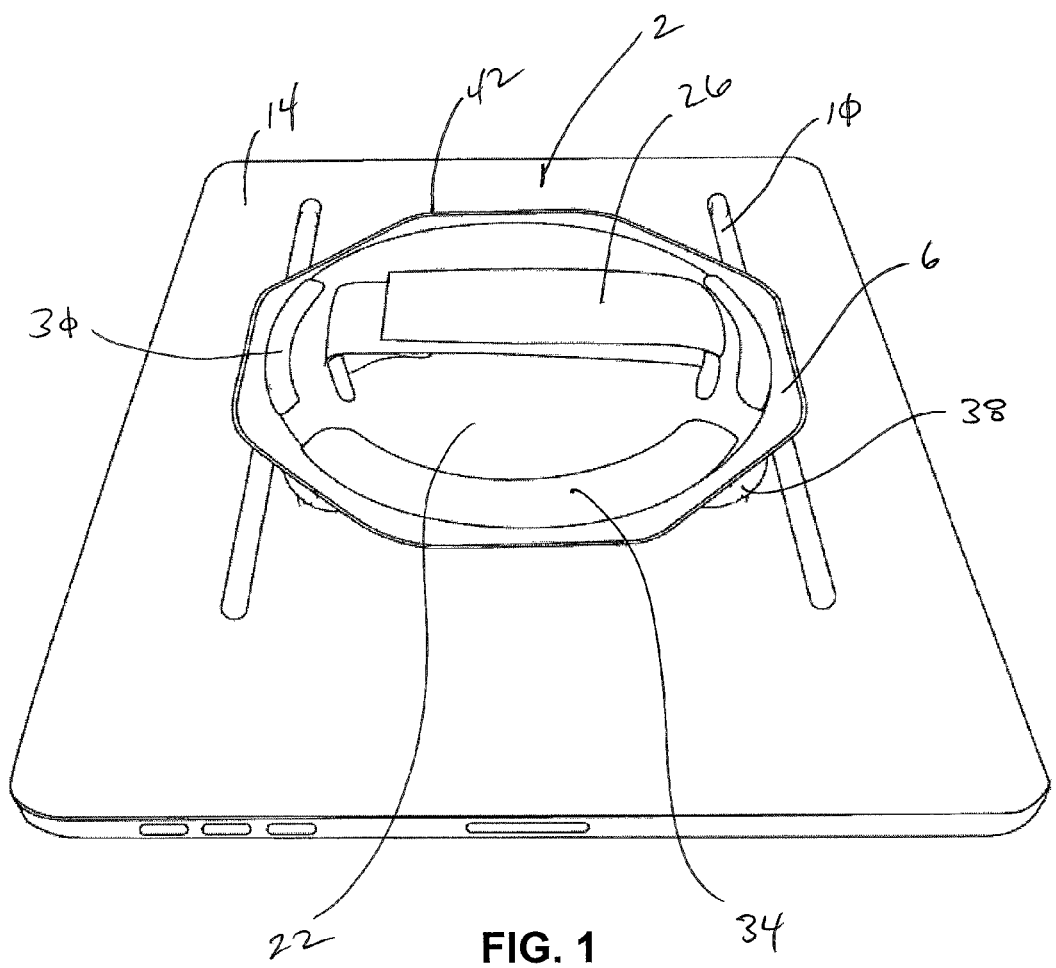
FIG. 1 is a top perspective view of a mobile device positioning grip and associated electronic device storage case.

To assist in the understanding of one embodiment of the present invention the following list of components and associated numbering found in the drawings is provided herein:

| # | Components |
|---|---|
| 2 | Mobile device positioning unit |
| 6 | Base plate |
| 10 | Rail |
| 14 | Storage case |
| 18 | Electronic device |
| 22 | Palm rest |

-continued

| # | Components |
|---|---|
| 26 | Strap |
| 28 | Hand |
| 30 | Slide trigger |
| 34 | Rotation trigger |
| 38 | Release trigger |
| 42 | Border |
| 44 | Arm |
| 50 | Ring |
| 54 | Stand |
| 58 | Groove |

It should be understood that the drawings are not necessarily to scale. In certain instances, details that are not necessary for an understanding of the invention or that render other details difficult to perceive may have been omitted. It should be understood, of course, that the invention is not necessarily limited to the particular embodiments illustrated herein.

DETAILED DESCRIPTION

FIG. 1 shows a mobile device positioning unit 2 ("unit") of one embodiment of the present invention. The unit 2 is comprised of a base plate 6 that is selectively interconnected to rails 10. The rails are interconnected to a storage case 14 that receives and protects an electronic device 18. The base plate 6 is also interconnected to a palm rest 22 that fits comfortably in a user's palm. The palm rest 22 may be capable of being inflated or deflated to accommodate hands of different sizes and shapes. Further, the palm grip, or other portions of the unit, may include a speaker system that amplifies the sound provided by the electronic device. The palm rest may also have one or more storage areas for the storage of batteries, screen wipes, business cards, etc. The user's hand is secured to the palm rest 22 by a strap 26. A plurality of sliding triggers 30 are provided that when depressed allow the base plate 6 to slide along the rails 10. Further, rotation triggers 34 are included that when depressed allow the palm rest 22 to rotate relative to the base plate 6. In some embodiments of the present invention the base plate 6 is selectively releasable from one or both rails 10. When released from one rail, the base plate 6 may be rotated away from the storage case and about the other to become a stand for positioning the storage case 14 and associated electronic device in portrait or landscape orientation, which will be described in further detail below.

When one or both slide triggers 30 are depressed, in some embodiments by a user's thumb, the palm rest is able to slide along the rails 10. Released of the slide triggers 30 will lock the palm rest in place. Similarly, when the rotation trigger 34 is depressed, the electronic device will rotate relative to the palm rest. Plate release triggers 38 may also be integrated into the base plate 6 that release the base plate 6 from a corresponding rail. When released, the base plate 6 is able to rotate away from the case 14 about the still-connected rail such that the base plate 6 becomes a stand that supports the electronic device for horizontal and vertical viewing. When both release triggers 38 are depressed, the base plate 6 is removable and can be mounted to another storage case 14. The base plate 6 may also include friction-enhancing border 42, i.e., mode of rubber, which prevents slippage when the base plate is used as a stand. Although the rotation, release, and slide triggers are shown in particular locations, such triggers may be incorporated in any manner on the unit 2. For example, the release triggers may be incorporated into a clip associated with the strap 26 instead of located under the base plate.

Figure 2:
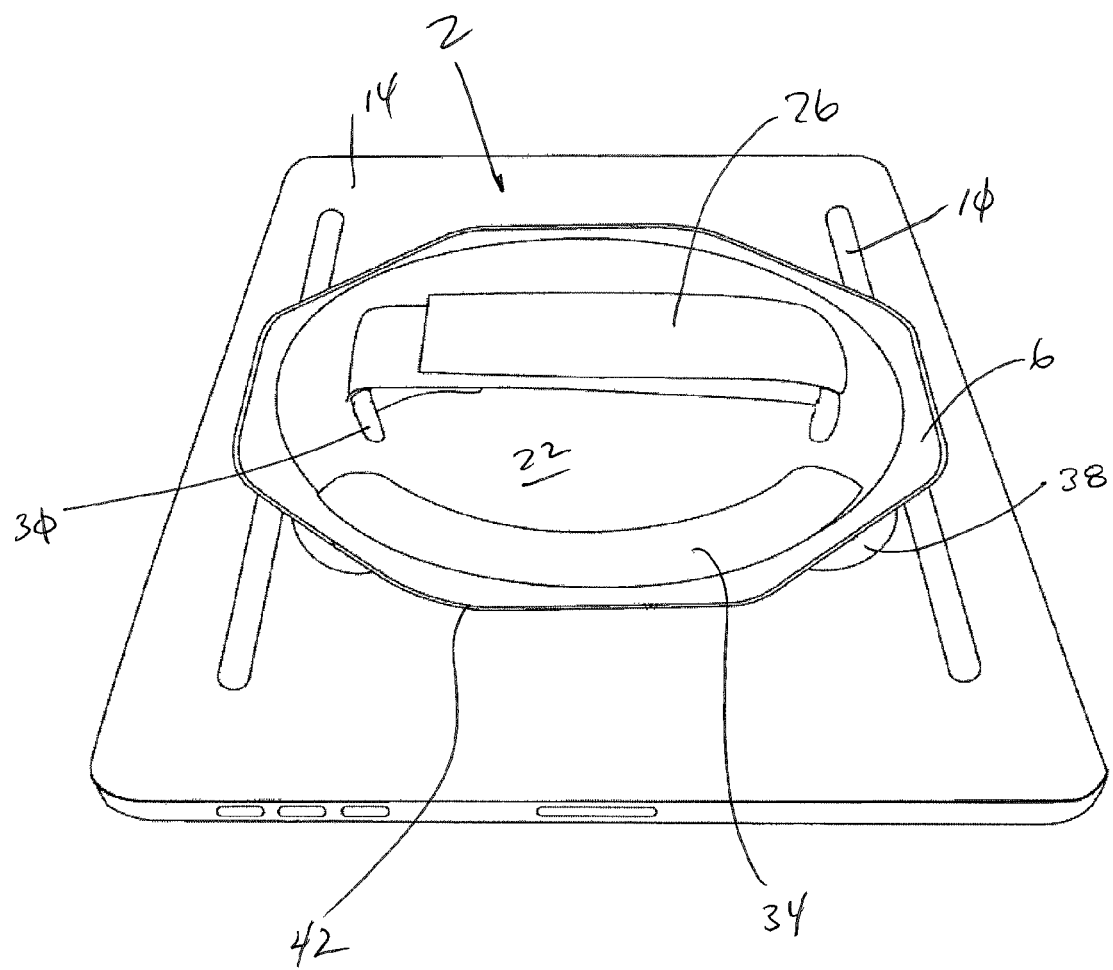
FIG. 2 is a top perspective view of a mobile device positioning grip and associated electronic device case.

FIG. 2 shows another embodiment of the present invention wherein the slide triggers 30 are recessed to allow the user's thumb to be more comfortably positioned. The slide triggers 30 may also be located inside a palm rest. The rotation trigger 34 of the is embodiment of the present invention is positioned as shown in the embodiment of the invention described above.

Figure 3:
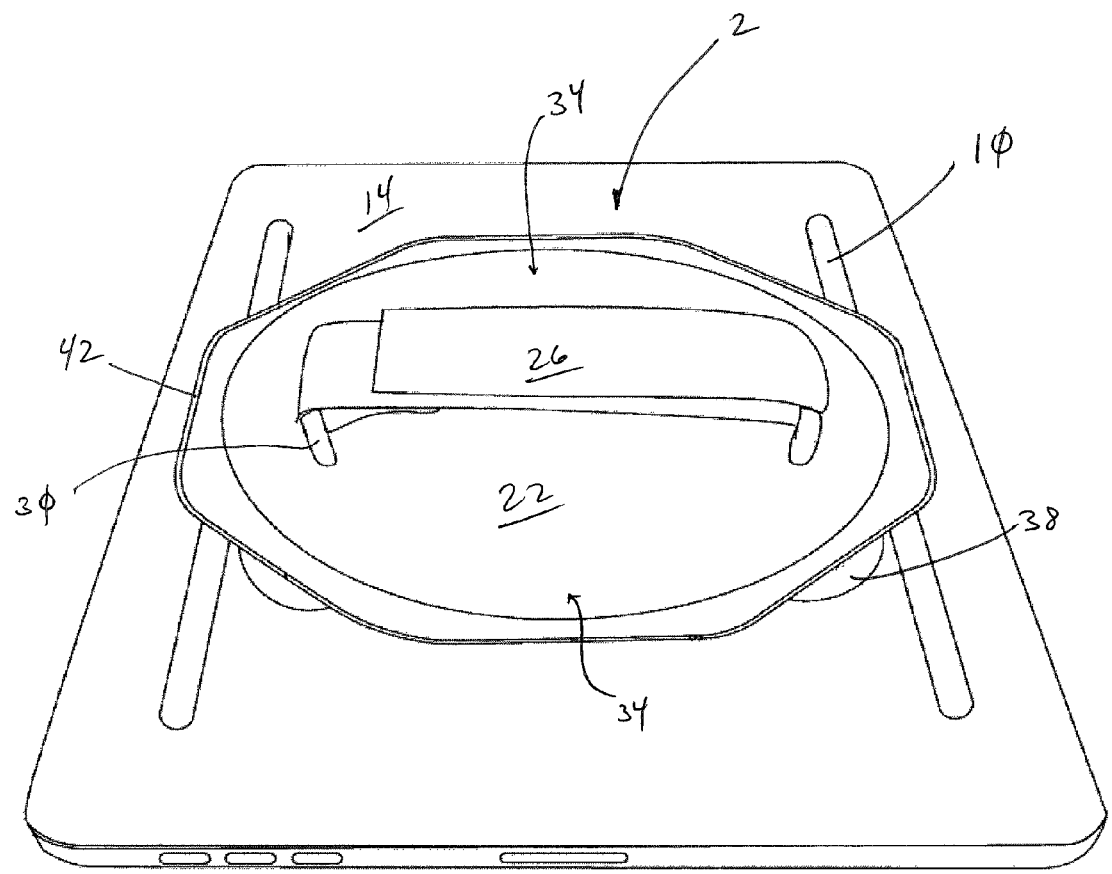
FIG. 3 is a perspective view of a mobile device positioning grip and associated electronic device case of another embodiment of the present invention.

Referring to FIG. 3, another embodiment of the present invention is shown similar to those described above. However, the slide triggers 30 are recessed and activated by pressing against a clip that secures the strap 26. Further, additional ergonomic support has been added to increase the shape of the palm rest 22. Here the rotation trigger 34 is recessed and may also be hidden within the fabric of which the palm rest 22 is comprised.

Figure 4:
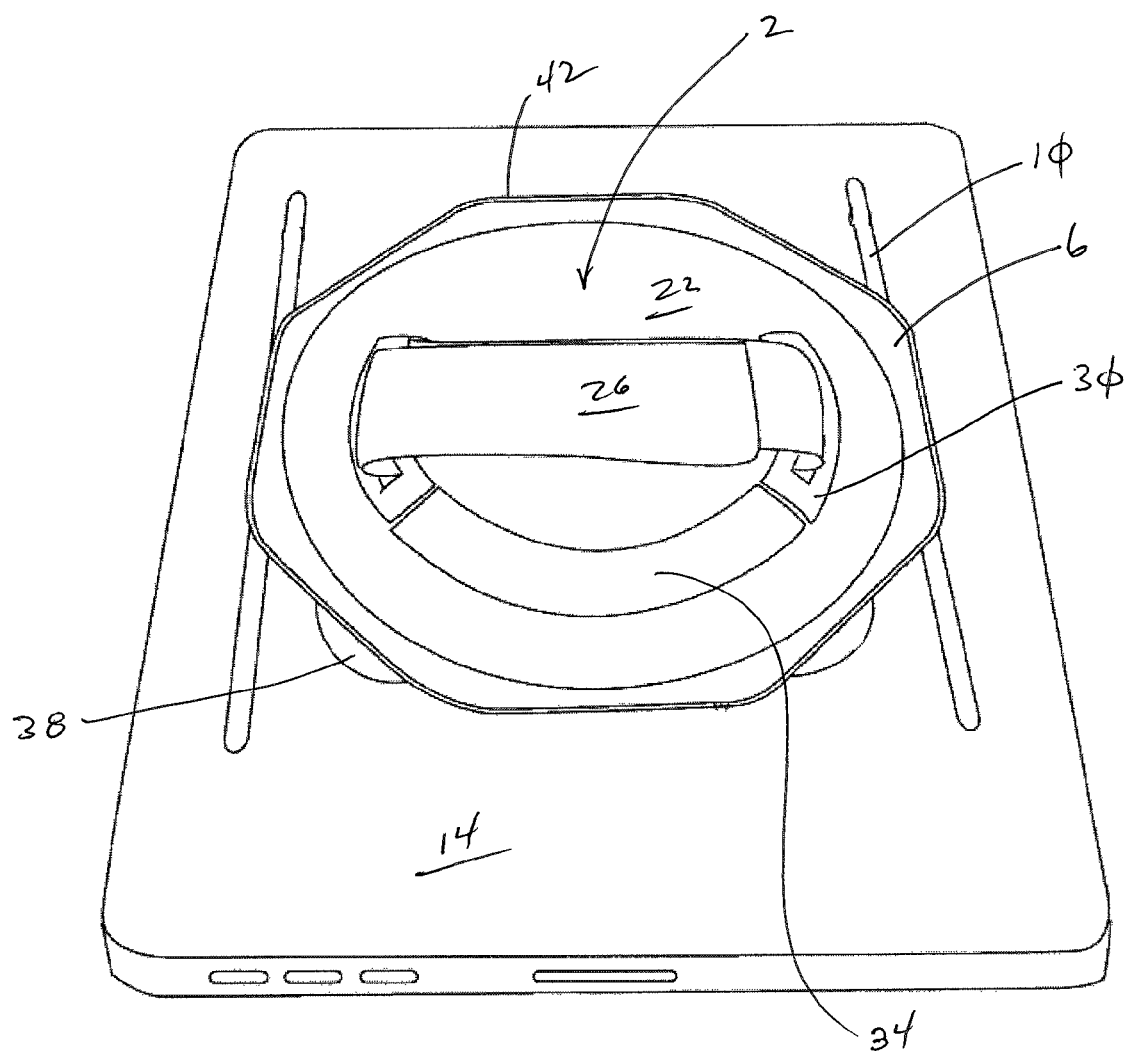
FIG. 4 is a top perspective view of the mobile device positioning grip and associated electronic device case of another embodiment of the present invention.

FIG. 4 shows yet another embodiment of the present invention wherein the slide triggers 30 are positioned outside of the palm rest fabric and the locations to which the strap 26 is interconnected functions as a slide trigger 30. This embodiment combines the trigger mechanism of the first and third embodiment described above. Further, the rotation trigger 34 is brought outside and blends in with the slide triggers 30.

Figure 5:
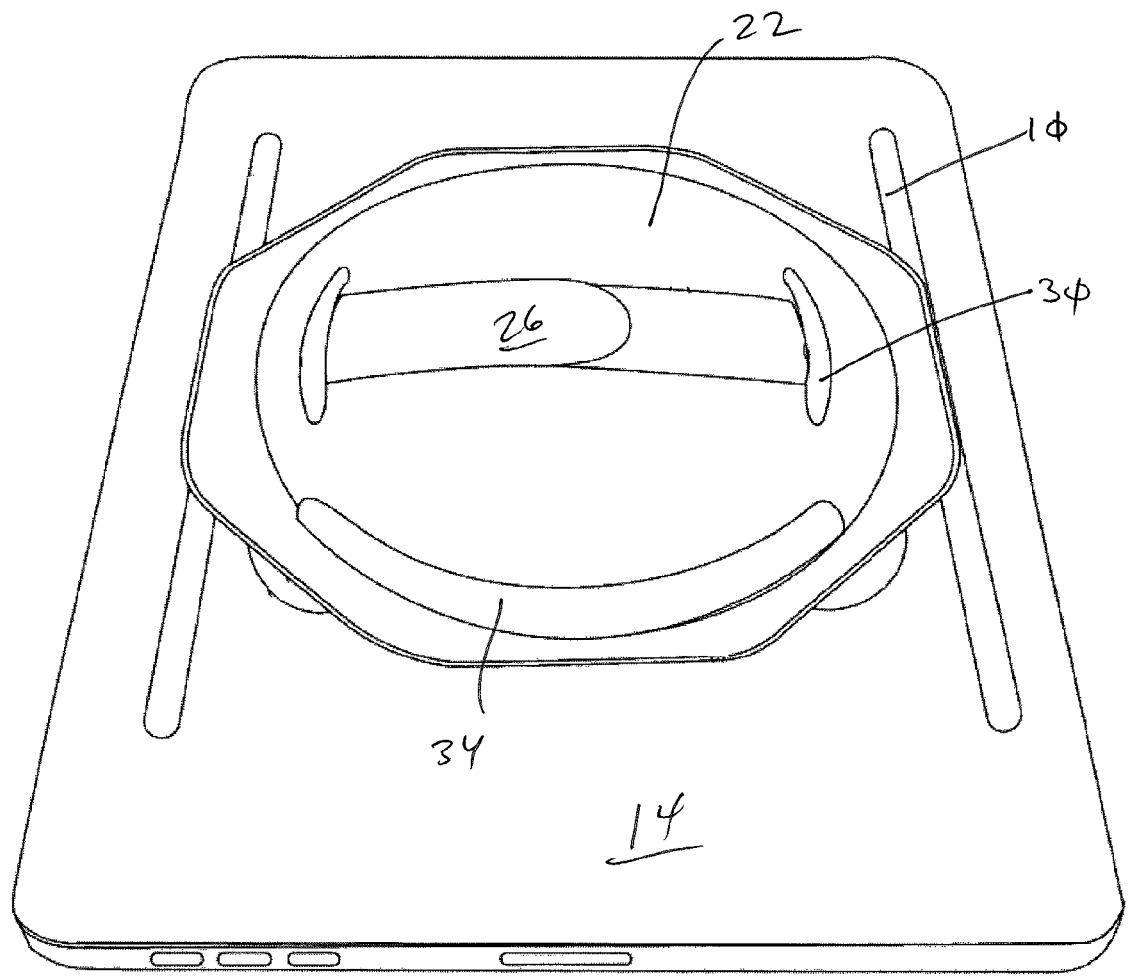
FIG. 5 is a top perspective view of a mobile device positioning grip and associated electronic device case of yet another embodiment of the present invention.

FIG. 5 shows yet another embodiment of the present invention wherein the slide triggers 30 are smooth and are actuated by pressing inwardly. The strap 26 attaches inside the slide triggers 30. In addition, the rotation trigger 34 is also smooth. All triggers are flush on the top surface allowing the device to sit flat when turned over. When the mobile device positioning unit 2 is transitioned towards an end of the rails 10, the stored electronic device will be positioned for portrait typing orientation. As one of skill in the art will appreciate, by moving the palm rest 22 along the rails 10, the angle of inclination of the electronic device will be altered.

Figure 6:
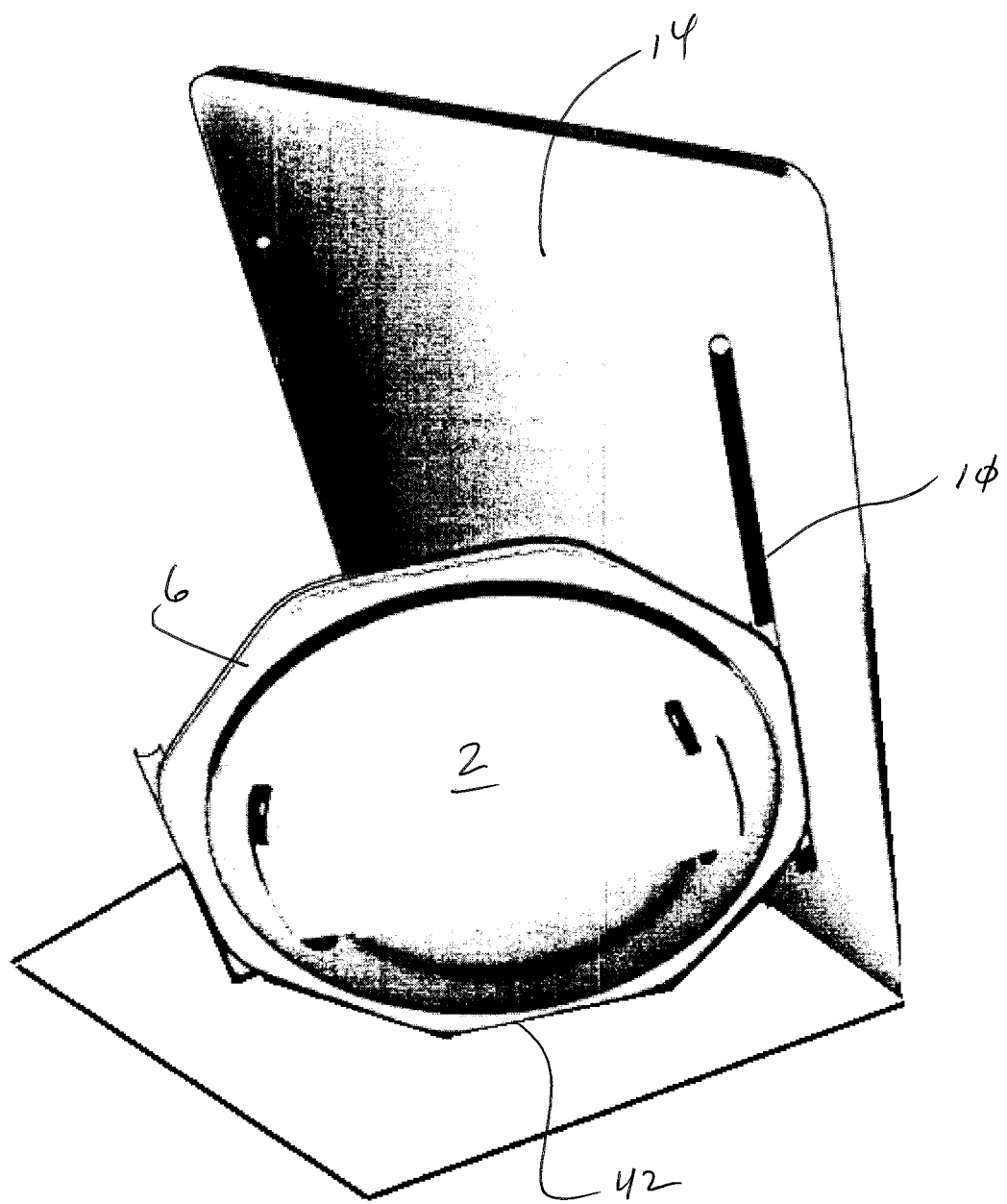
FIG. 6 is a rear perspective view of a mobile device positioning grip and associated case in a portrait viewing position.
Figure 7:
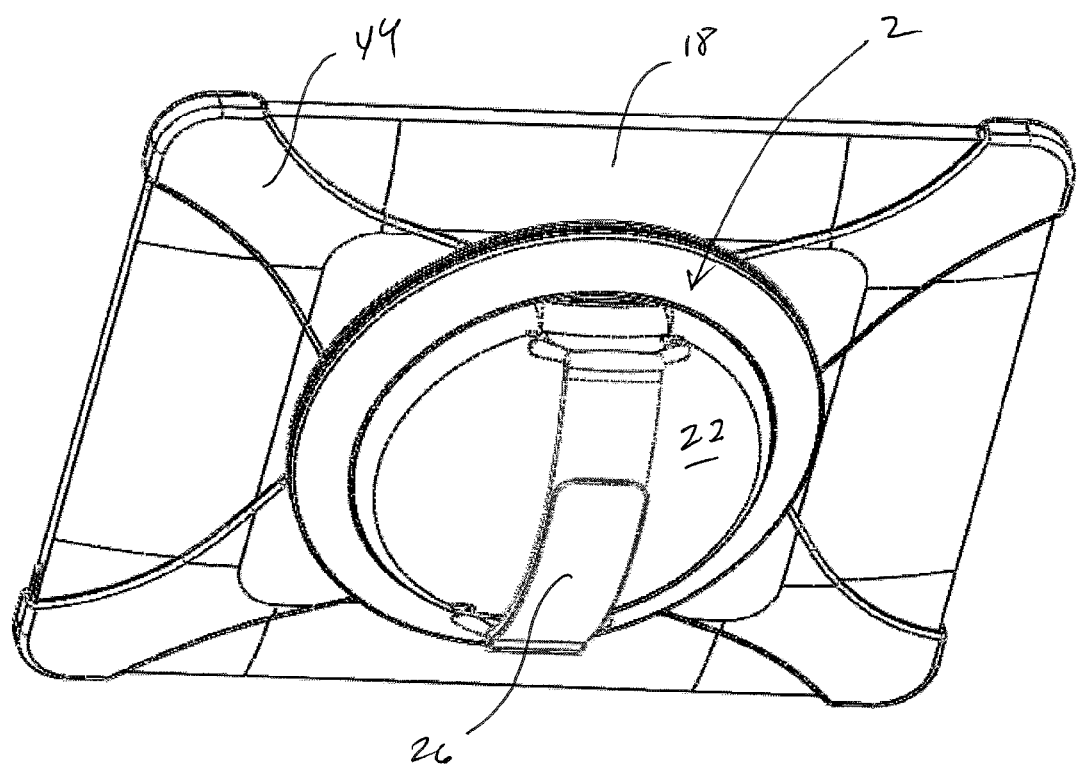
FIG. 7 is a rear perspective view of a mobile device positioning system of another embodiment of the present invention.
Figure 8:
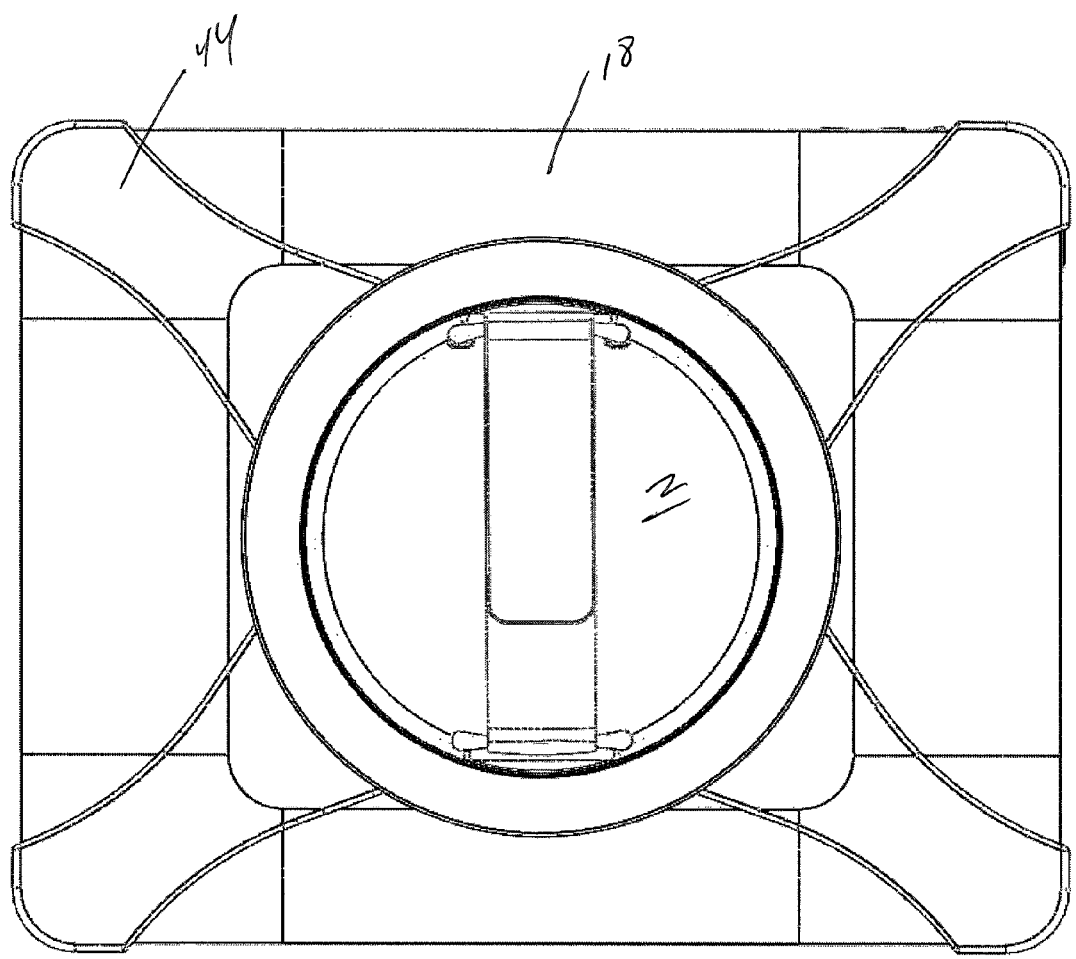
FIG. 8 is a top plan view of FIG. 7.
Figure 9:
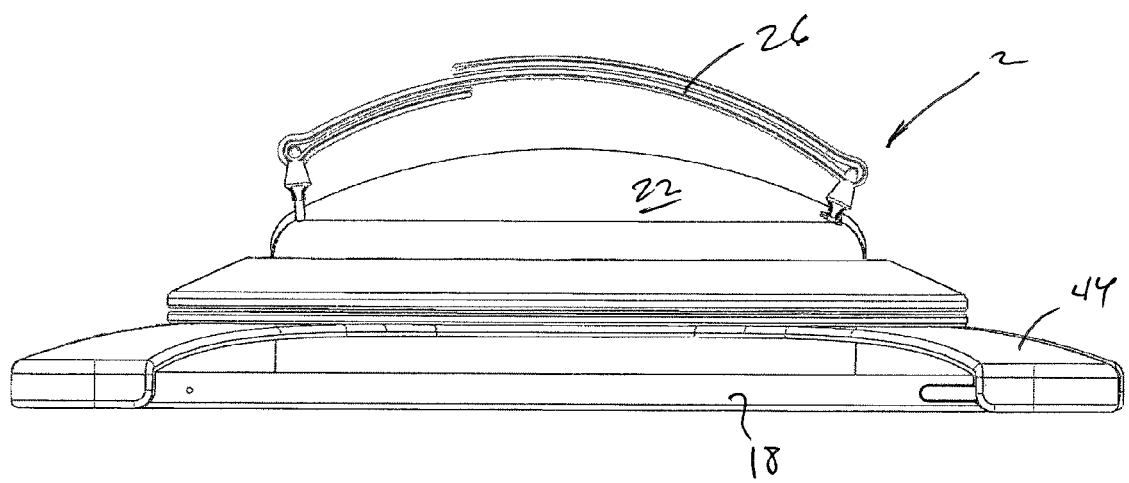
FIG. 9 is a side elevation view of FIG. 7.
Figure 10:
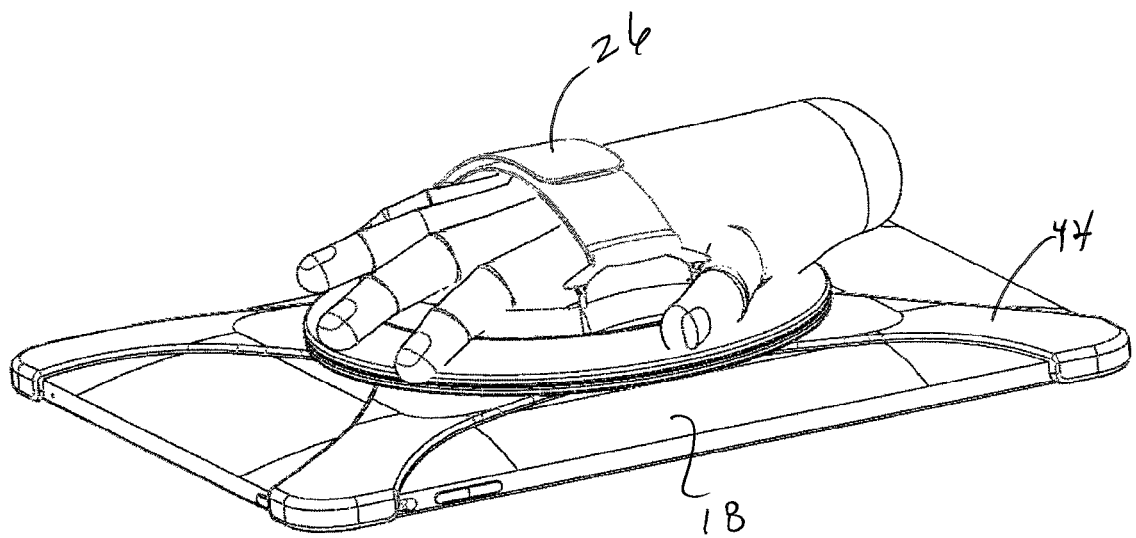
FIG. 10 is a perspective view of a user's hand positioned in the mobile device positioning system of FIG. 7.
Figure 11:
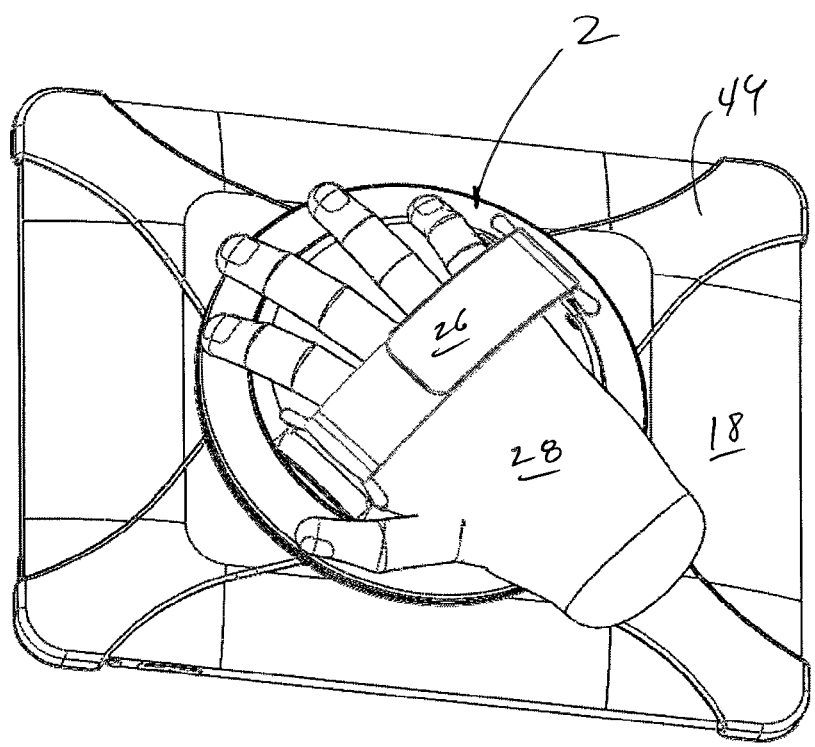
FIG. 11 is a perspective view of a user's hand positioned in the mobile device positioning system of FIG. 7.
Figure 12:
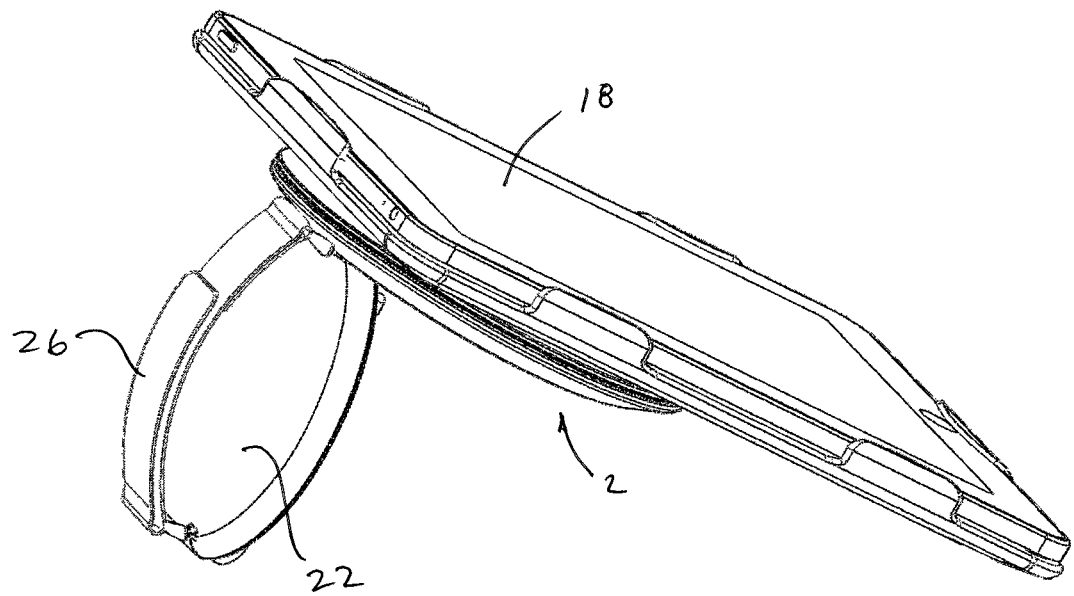
FIG. 12 is a side perspective view showing a mobile device positioning unit and associated electronic device oriented for portrait typing.
Figure 13:
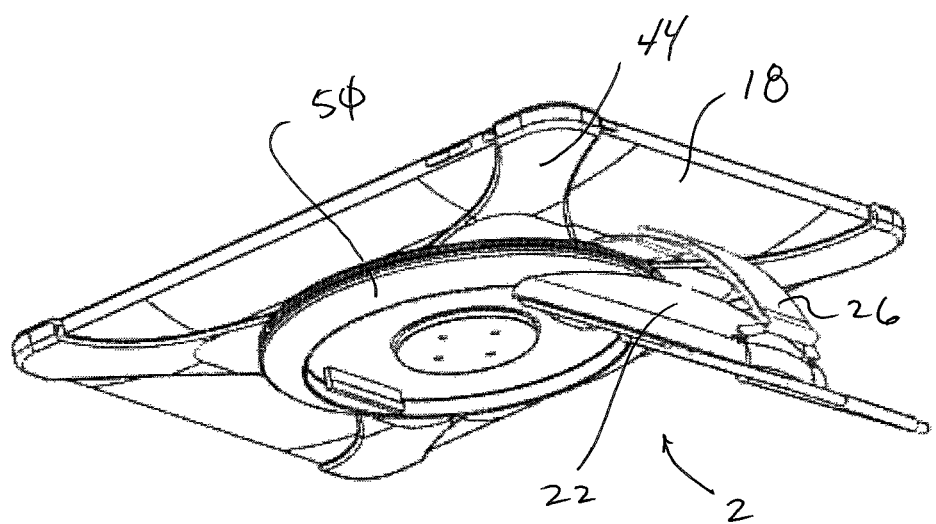
FIG. 13 is a rear perspective view showing a mobile device positioning unit and associated electronic device oriented for portrait typing.
Figure 14:
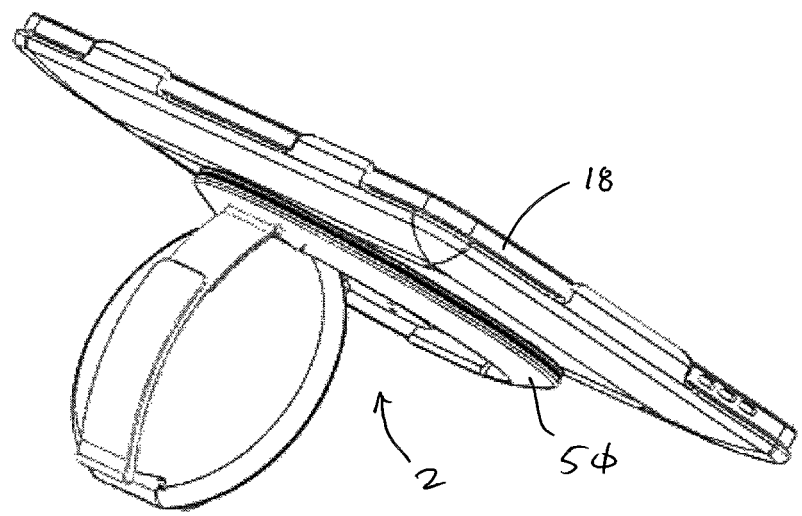
FIG. 14 is a rear perspective view showing a mobile device positioning unit and associated electronic device oriented for landscape typing.
Figure 15:
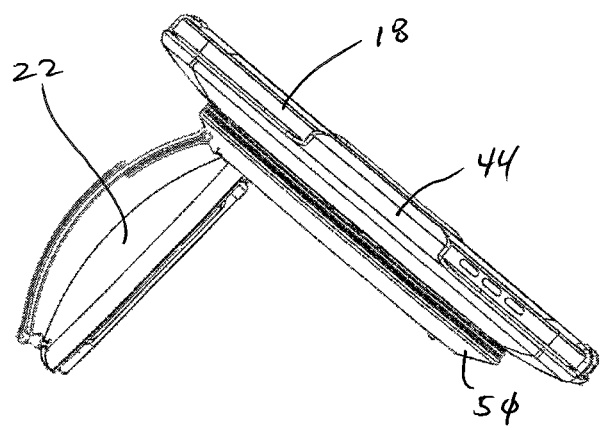
FIG. 15 is a side elevation view showing a mobile device positioning unit and associated electronic device oriented for landscape typing.
Figure 16:
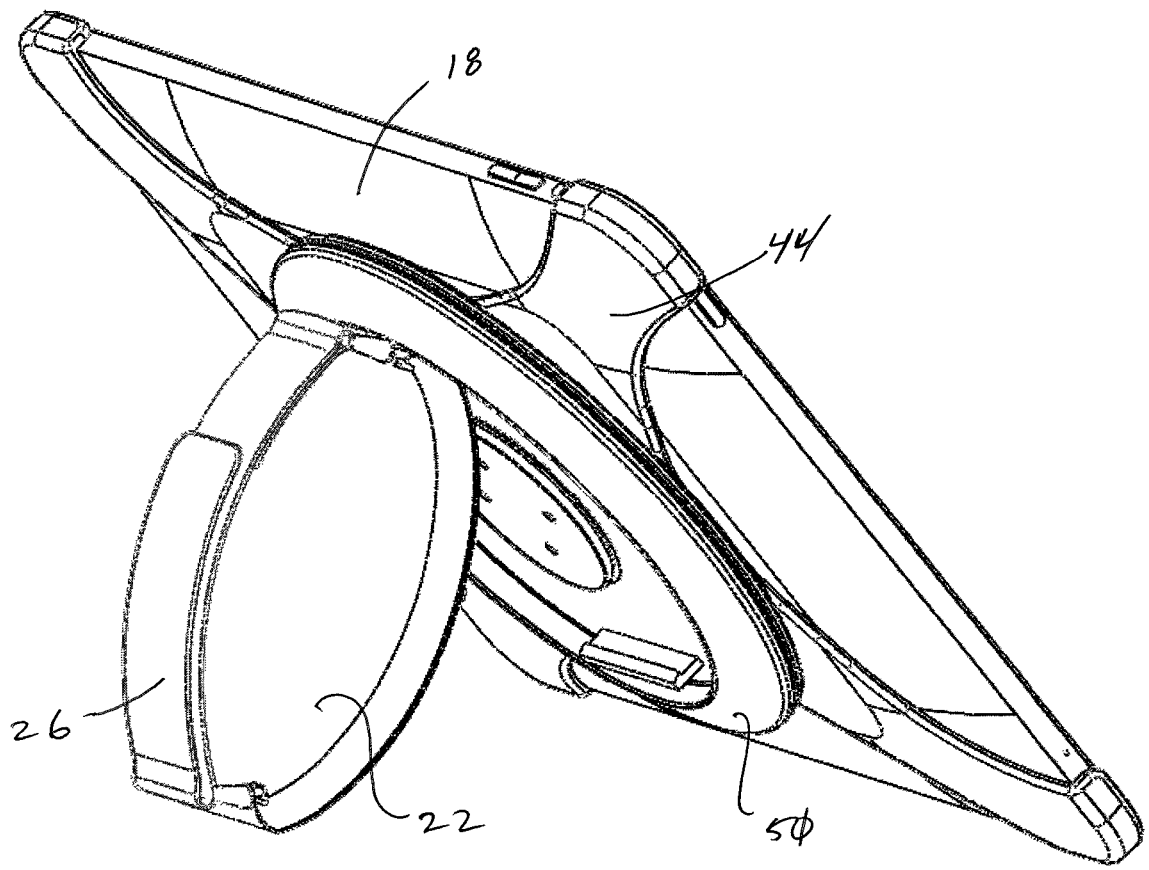
FIG. 16 is a side elevation view showing a mobile device positioning unit and associated electronic device oriented for landscape typing.
Figure 17:
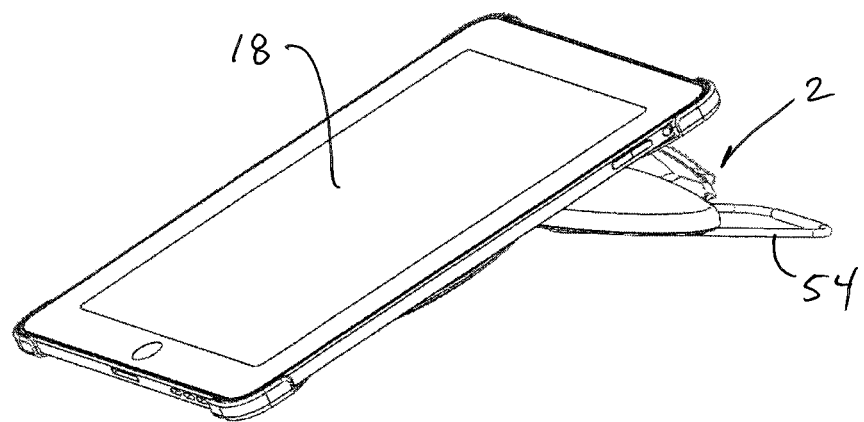
FIG. 17 is a side perspective view showing a mobile device positioning unit having a deployable stand and associated electronic device in a portrait typing position.
Figure 18:
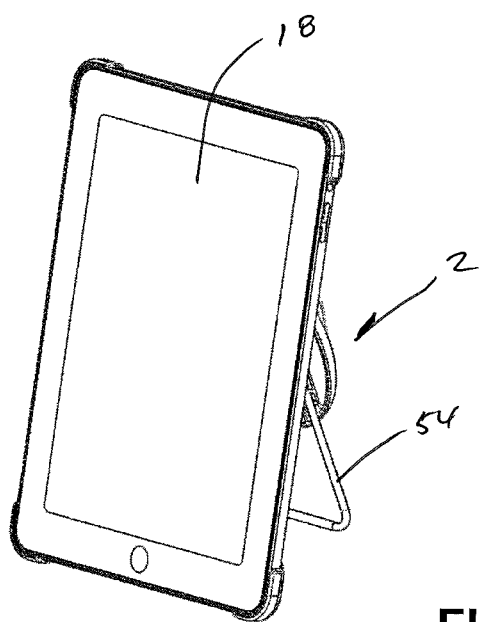
FIG. 18 is a front perspective view showing a mobile device positioning unit having a deployable stand and associated electronic device in a portrait typing position.
Figure 19:
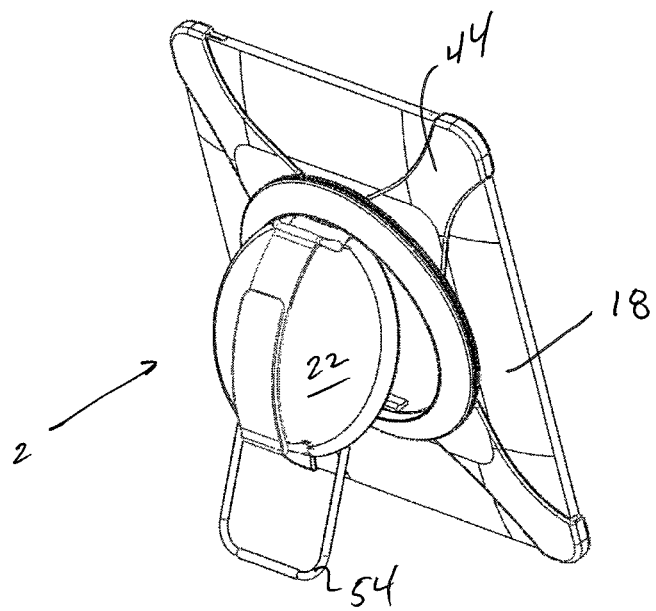
FIG. 19 is a rear perspective showing a mobile device positioning unit having a deployable stand and associated electronic device in a portrait viewing position.
Figure 20:
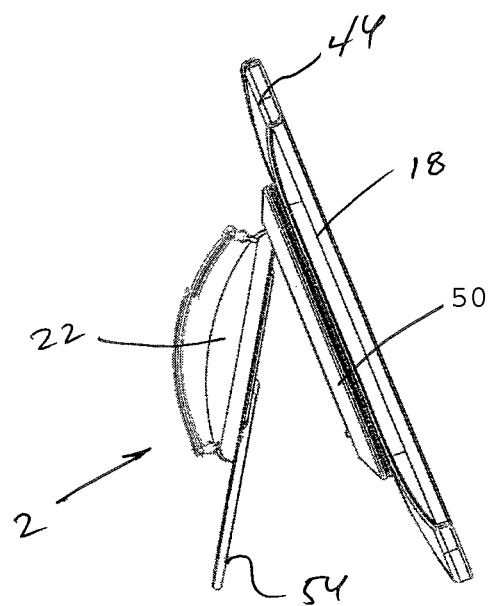
FIG. 20 is a side elevation view showing a mobile device positioning unit having a deployable stand and associated electronic device in a portrait viewing position.
Figure 21:
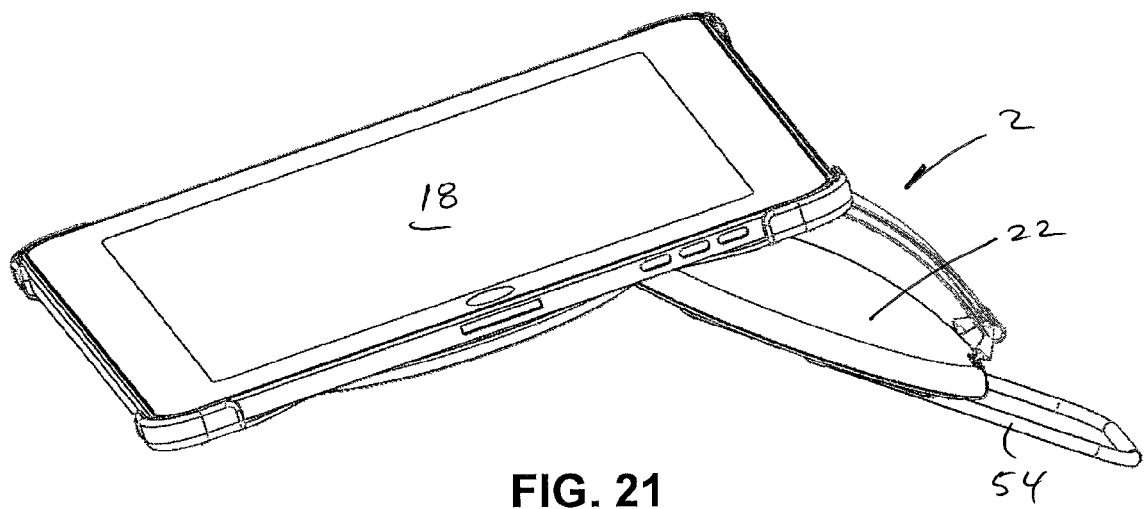
FIG. 21 is a side perspective view showing a mobile device positioning unit having a deployable stand and associated electronic device in a landscape typing position.
Figure 22:
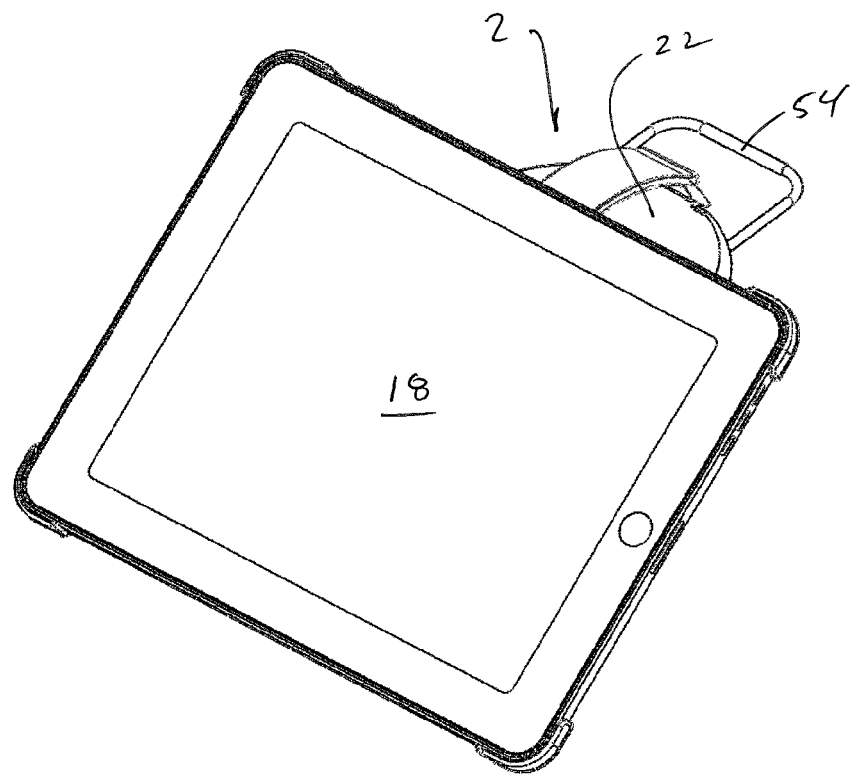
FIG. 22 is a top perspective view showing a mobile device positioning unit having a deployable stand and associated electronic device in a landscape typing position.
Figure 23:
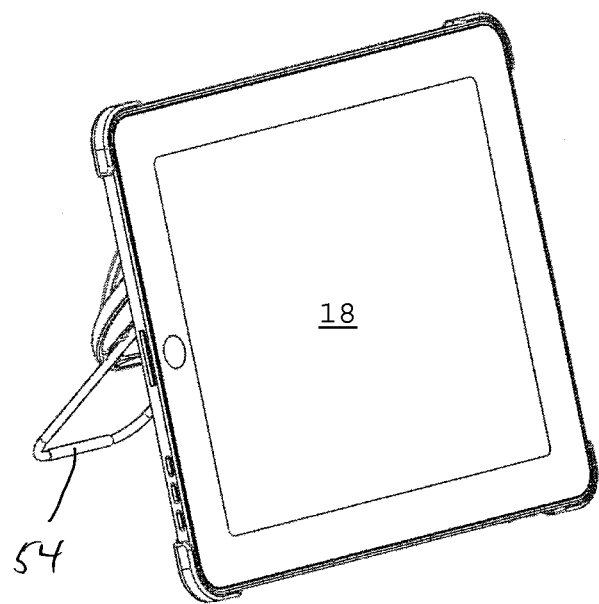
FIG. 23 is a front perspective view showing a mobile device positioning unit having a deployable stand and associated electronic device in a landscape viewing position.
Figure 24:
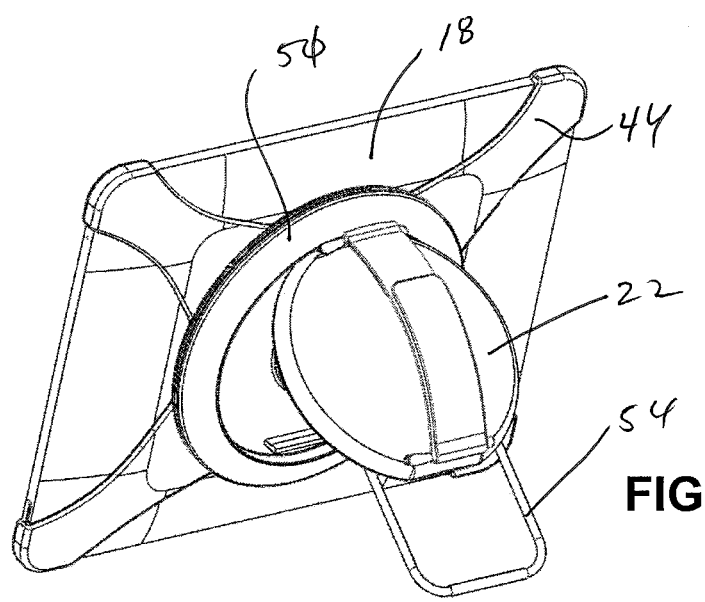
FIG. 24 is a rear perspective view showing a mobile device positioning unit having a deployable stand and associated electronic device in a landscape viewing position.
Figure 25:
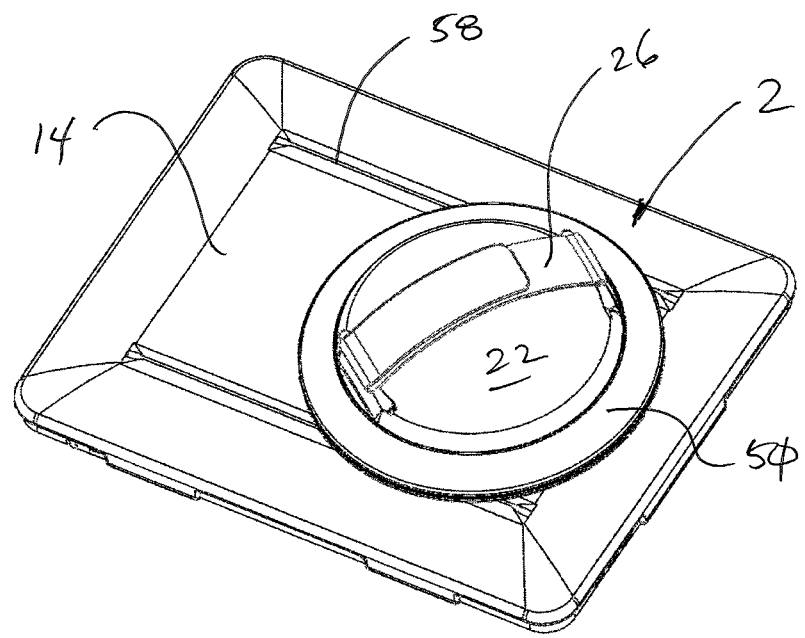
FIG. 25 is a rear perspective view of a mobile device positioning unit and associate a case of yet another embodiment of the present invention.
Figure 26:
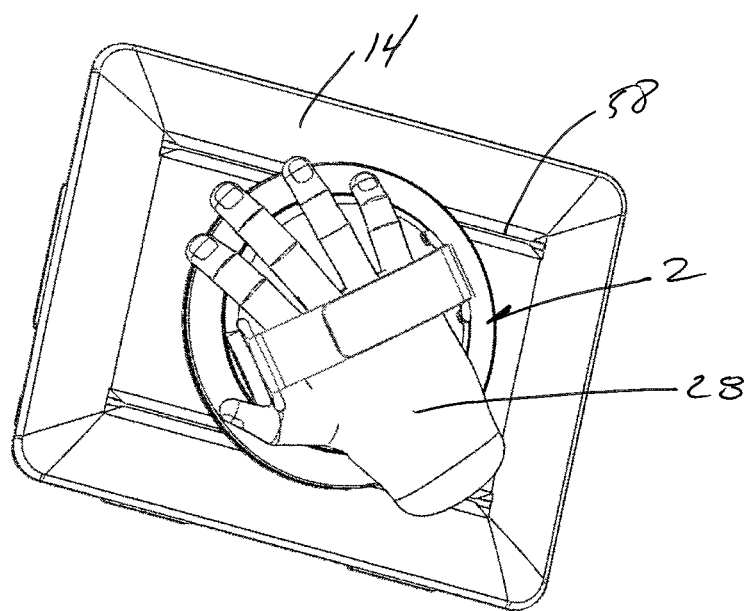
FIG. 26 is a rear perspective view of the mobile device positioning unit engaged onto a user's hand.

FIG. 6 shows how the positioning unit 2 may be used as a stand for viewing wherein the base plate 6 has been separated from one rail by pressing one of the release buttons 38. The base plate 6 is then rotated away from the storage case to form a stand for supporting the storage case 14 in a portrait position. A border edge 42 of the base engages a horizontal surface which orients the electronic device for landscape viewing.

FIGS. 7-11 show yet another embodiment of the present invention that is secured to the electronic device 18 (or storage case) by a plurality of arms 44. Here, the storage case 14 employs a palm rest 22 that is rotatably interconnected to a base plate 6. A strap 26 is also provided to help secure a user's hand 28. This embodiment also does not employ multiple trigger mechanisms. This embodiment may include one or more triggers and associated mechanisms that allow the palm rest 22 to rotate relative to the arms 44.

FIGS. 12-16 show how this embodiment of the present invention can be used for portrait typing (FIGS. 12 and 13), landscape viewing (FIG. 16), landscape typing (FIGS. 14 and 15), etc. Here, the palm rest 22 is rotated away from the storage case 14 and the ring 50. The angle between the palm rest 22 and a fixed ring 50 will define the electronic device 18 inclination. For example, for viewing, the palm rest 22 is rotated away from the fixed ring 50 so that a portion of the palm rest 22 can be engaged onto a table which will prop the electronic device at a desired angle.

FIGS. 17-24 show an embodiment of the present invention that employs a deployable stand that allow the user to effectively alter the length of the palm rest 22. The stand 54 has an edge that engages a table to prop the electronic device 18 at a desired inclination. The stand 54 can be used to hang the electronic device 18.

Figure 27:
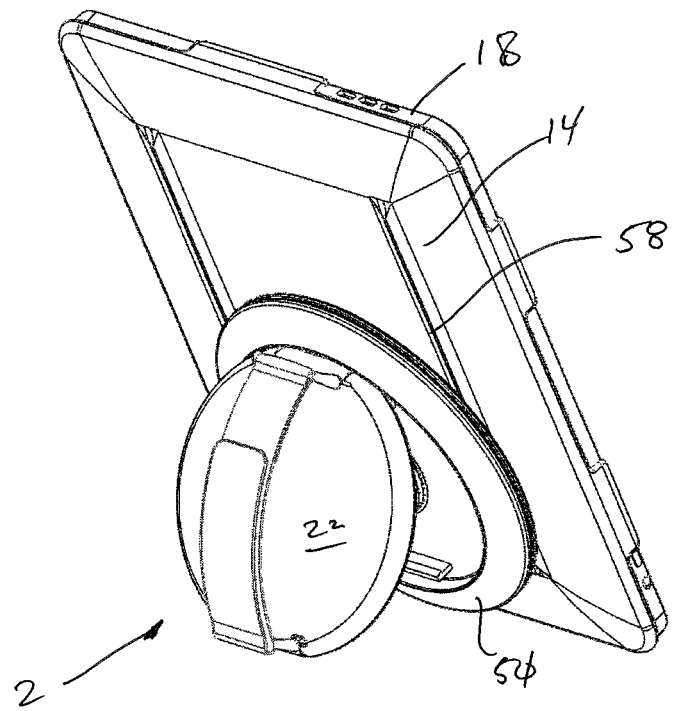
FIG. 27 is a rear perspective view of the mobile device positioning unit of FIG. 25 shown in a portrait viewing position.
Figure 28:
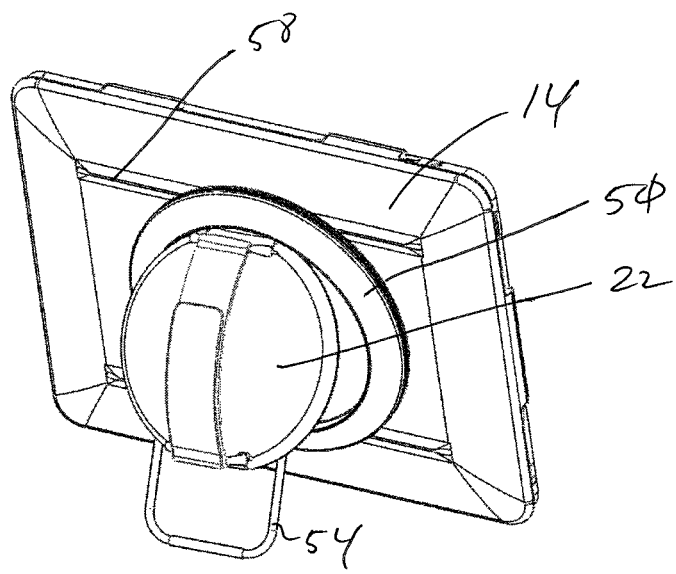
FIG. 28 is a rear perspective view of a mobile device positioning unit having a deployable stand shown in a landscape viewing orientation.

FIGS. 25-28 show yet another embodiment of the present invention wherein the rails are more aptly described as recesses, channels, or grooves 58 that are integrated into the storage case 14. The base plate 6 includes protrusions that are inserted into the grooves 58, thereby allowing the base plate 6 to move laterally along the length of the storage case 14. In this embodiment, as shown in FIGS. 27 and 28, the palm rest 22 is selectively removable from the ring 50 to provide a stand for viewing. The palm rest 22 may also employ a stand 54.

While various embodiments of the present invention have been described in detail, it is apparent that modifications and alterations of those embodiments will occur to those skilled in the art. For example, the features and aspects of the provisional applications listed above may be combined with those described herein to yield various ways to provide any number of systems for selective interconnection with an electronic device. However, it is to be expressly understood that such modifications and alterations are within the scope and spirit of the present invention, as set forth in the following claims. Further, the invention(s) described herein is capable of other embodiments and of being practiced or of being carried out in various ways. In addition, it is to be understood that the phraseology and terminology used herein is for the purpose of description and should not be regarded as limiting. The use of "including," "comprising," or "having" and variations thereof herein is meant to encompass the items listed thereafter and equivalents thereof as well as additional items.

What is claimed is:

1. A system for securing and selectively positioning an electronic device, comprising:
    a base member having a plurality of arms adapted for selective interconnection with an edge of the electronic device;
    a user interface operatively interconnected to said base member, said user interface capable of rotating relative to said base member;
    wherein said user interface includes an actuator that, when depressed, allows at least a portion of said user interface to rotate relative to said base member; and
    wherein said user interface comprises a ring and a palm rest that selectively rotates within said ring.

2. The system of claim 1, wherein said user interface may be locked relative to said base member.

3. A device for selectively positioning an interconnected electronic device, comprising:
    a case that is adapted to selectively receive the electronic device;
    at least one rail interconnected to said case;
    a plate slidingly engaged to said at least one rail;
    a palm rest operatively interconnected to said plate;
    wherein said palm rest includes an actuator that, when pressed, allows said palm rest to rotate relative to said plate.

4. The device of claim 3 wherein said palm rest includes a second actuator that when pressed allows said plate to selectively move along said at least one rail.

5. The device of claim 3, further comprising a strap that is associated with said palm rest wherein a space is provided between said strap and said palm rest that is adapted to receive a user's hand.

6. The device of claim 3, further comprising at least one plate release actuator associated with said plate that, when pressed, releases a first portion of said base plate from a corresponding rail.

7. The device of claim 3, wherein said palm rest includes an extendable arm.

8. The device of claim 3, wherein said plate is comprised of a ring and wherein said palm rest is adapted to rotate within the ring.

9. A device for selective association with an electronic device, comprising:
    a base portion that is adapted to be selectively associated with the electronic device;
    a user interface operatively interconnected to said base portion, said user interface capable of rotating relative to said base portion and being locked relative to said base portion;
    wherein a portion of said user interface is hingedly associated with said base portion; and
    wherein said base portion is interconnected to a case that is adapted to receive the electronic device.

10. The device of claim 9, wherein said user interface includes an actuator for releasing a locking mechanism, which is integrated into at least one of said base portion and said user interface, wherein release of said locking mechanism allows said user interface to rotate relative to said base portion.

11. The device of claim 9 wherein said base portion is selectively interconnected to rails that are interconnected with said case.

12. The device of claim 9, further comprising a second actuator for releasing a second locking mechanism, which is integrated into at least one of said base portion and said user interface, wherein release of said second locking mechanism allows said portion of said user interface to rotate away from said base portion.

13. The device of claim 9, wherein said user interface includes a release actuator that, when depressed, releases a palm rest of said user interface from a ring of said base portion.

14. The device of claim 9, wherein said portion of said user interface includes a deployable kickstand.

15. A device for selectively positioning an interconnected electronic device, comprising:
    a case that is adapted to selectively receive the electronic device;
    a member that is operatively interconnected to said case, said member capable of rotating relative to said case; and
    a strap that is associated with said member wherein a space is provided between said strap and said member that is adapted to receive a user's hand, and wherein said strap is hingedly interconnected to said member such that said strap is adapted to prop the electronic device at a desired inclination.

* * * * *